(12) United States Patent
Koinuma et al.

(10) Patent No.: US 7,507,290 B2
(45) Date of Patent: Mar. 24, 2009

(54) FLUX ASSISTED SOLID PHASE EPITAXY

(75) Inventors: Hideomi Koinuma, Tokyo (JP); Yuji Matsumoto, Yokohama (JP); Ryota Takahashi, Tokyo (JP)

(73) Assignee: Japan Science and Technology Agency, Saitama (JP)

( * ) Notice: Subject to any disclaimer, the term of this patent is extended or adjusted under 35 U.S.C. 154(b) by 175 days.

(21) Appl. No.: 10/593,897

(22) PCT Filed: Mar. 22, 2005

(86) PCT No.: PCT/JP2005/005642

§ 371 (c)(1),
(2), (4) Date: Sep. 22, 2006

(87) PCT Pub. No.: WO2005/090649

PCT Pub. Date: Sep. 29, 2005

(65) Prior Publication Data

US 2007/0209571 A1    Sep. 13, 2007

(30) Foreign Application Priority Data

Mar. 23, 2004  (JP)  ............................. 2004-085232

(51) Int. Cl.
*C30B 1/10*  (2006.01)
(52) U.S. Cl. ................... 117/4; 117/5; 117/8; 117/9; 117/940
(58) Field of Classification Search ............. 117/4, 117/5, 8, 9, 940
See application file for complete search history.

(56) References Cited

U.S. PATENT DOCUMENTS

2005/0266663 A1* 12/2005 Bojarczuk et al. ........... 438/482

(Continued)

FOREIGN PATENT DOCUMENTS

JP    2-64098 A    3/1990

(Continued)

OTHER PUBLICATIONS

Translation of the International Preliminary Report on Patentability of International Application No. PCT/JP2005/005642, with Form PCT/IB/373 and Form PCT/ISA/237, dated Oct. 26, 2006.

(Continued)

*Primary Examiner*—Robert M Kunemund
(74) *Attorney, Agent, or Firm*—Westerman, Hattori, Daniels & Adrian, LLP.

(57) ABSTRACT

A flux assisted solid phase epitaxy that can make a thin film having a crystalline perfection comparable with that of a bulk crystal and at a reduced cost is provided in which an amorphous film of a mixture of an objective substance to be grown epitaxially and a flux of a substance producing a eutectic with the objective substance but not producing any compound therewith is deposited on a substrate at a temperature less than a eutectic point of the substances, and the substrate is heat-treated at a temperature not less than the eutectic point of the objective and flux substances. A solid phase reaction, namely solid phase diffusion causes the objective and flux substances to be mixed together to form a liquid phase in their eutectic state from which the objective substance precipitates and epitaxially grows on the substrate.

15 Claims, 5 Drawing Sheets

500μm×500μm

U.S. PATENT DOCUMENTS

2006/0288925 A1  12/2006  Koinuma et al.

FOREIGN PATENT DOCUMENTS

| JP | 2-289496 A | 11/1990 |
| --- | --- | --- |
| JP | 7-57535 A | 3/1995 |
| JP | 7-126834 A | 5/1995 |
| JP | 2002-68893 A | 3/2002 |
| JP | 2005-1987 A | 1/2005 |

OTHER PUBLICATIONS

Takeshi Kijima et al., "New Low-Temperature Processing of Metalorganic Chemical Vapor Deposition-$Bi_4Ti_3O_{12}$ Thin Films Using BiOx Buffer Layer", Jpn. J. Appl. Phys. vol. 38 (1999) pp. 127-130.

X.Q. Pan et al., "Domain structure of epitaxial $Bi_4Ti_3O_{12}$ thin films grown on (001) $SrTiO_3$ substrates", Applied Physics Letters vol. 83, No. 12, Sep. 22, 2003, pp. 2315-2317.

K.S. Yun, "Tri-Phase Epitaxy", Journal of the Metallurgical Society of Japan vol. 66, No. 4, (2002), pp. 284-288.

International Search Report of PCT/JP2005/005642 date of mailing Jun. 7, 2005.

* cited by examiner

FLUX ASSISTED SOLID PHASE EPITAXY

TECHNICAL FIELD

The present invention relates to a flux assisted solid phase epitaxy or epitaxial growth method whereby a thin film can be grown which though being a thin film has a crystalline perfection that can compare with that of a bulk crystal.

BACKGROUND ART

In recent years, attention has been focused on the use as next-generation nonvolatile ferroelectric memory materials of single crystal thin films of multi-component oxides of which Bi (bismuth) is a constituent element. One reason is that a multi-component oxide which contains Bi as a constituent element has generally a large spontaneous dielectric polarization and its dielectric properties deteriorate quite a little with repeated polarization reversals. Another reason is that a multi-component oxide which contains Bi as a constituent element has generally a crystal structure of perovskite type which is easy to epitaxially grow on many substances, and is optimum for use as a thin film material for nonvolatile ferroelectric memories having a degree of integration on the level of a VLSI (very large scale integrated circuit) since an epitaxially grown thin film is low in defect.

Of multi-component oxides of which Bi is a constituent element, especially $Bi_4Ti_3O_{12}$ being excellently large in the magnitude of spontaneous polarization and easy in its single-crystallization in the form of a thin film has vigorously been studied as to its polarization mechanism and methods of making its single-crystal thin film which is low in defect (See: Takeshi Kijima, et al., Jpn. J. Appl. Phys. Vol. 38 (1999) pp. 127-130 and X. Q. Pan, et al., APPLIED PHYSICS LETTERS Vol. 83, No. 12, 22 Sep. 2003, pp. 2315-2317.).

By the way, the use of a thin film as a material for a highly integrated device as mentioned above requires the thin film to be low in the density of defects such as dislocations and grain boundaries and to have an atomically flat surface, i. e., to be high in crystallinity or crystalline perfection. Accordingly, techniques have so far been studied of making a thin film higher in crystalline perfection, using a vapor phase growth method such as CVD (chemical vapor deposition), laser ablation or sputtering process.

In the vapor phase growth methods, however, which are essentially growth methods in a non-equilibrium state, it is difficult to eliminate defects such as grain boundaries and dislocations completely and due to these defects it is hard to obtain an atomically flat surface.

The present inventors have developed the Tri-Phase Epitaxy which is designed to effect crystal growth in a state that a solid, a liquid and a gas phase coexist (See Journal of the Metallurgical Society of Japan Vol. 66, No. 4 (2002), pp. 284-288.). This method is a method in which a seed layer is built up on a substrate surface and has a layer of a substance (hereinafter referred to as "flux layer") built thereon which is capable of producing a eutectic crystal with an objective substance but not producing any compound with the objective substance, and the objective substance is fed by a vapor phase growth method onto the flux layer heated at a temperature not less than the eutectic point to epitaxially grow. In this method, the objective substance in the flux layer comes to be in a liquid phase from which the objective substance precipitates on the seed layer to epitaxially grow. Being essentially a liquid phase epitaxy and thus close to crystal growth from a thermal equilibrium state, this method can grow on a substrate a thin film which though being a thin film has a crystalline perfection comparable with that of a bulk crystal. Using this method, the present inventors have also succeeded in the making of a multi-component oxide containing Bi as a constituent element, which though in the form of a thin film has a crystalline perfection that can compare with that of a bulk crystal (See JP 2005-1987 A).

DISCLOSURE OF THE INVENTION

By the way, the Tri-Phase Epitaxy requires a state that three phases coexist, namely a vapor phase made of an objective substance, a liquid phase made of a flux and the objective substance, and a solid phase that precipitates from the liquid phase for growth on a substrate. It also requires that in a film forming apparatus, a substrate be held at a fixed high temperature, namely at a fixed temperature not less than a eutectic point to maintain a liquid phase state while effecting vapor phase growth. For example, as shown in Example 1 of JP 2005-1987, growing a $Bi_4Ti_3O_{12}$ ferroelectric thin film by about 500 nm requires a substrate to be held at a temperature of 700° C. for about 1 hour. The film forming apparatus that can grow a film while maintaining the substrate at a fixed high temperature is generally either small in throughput or high in apparatus cost if it is large in throughput. Therefore, while the Tri-Phase Epitaxy is capable of obtaining a thin film whose crystalline perfection is quite high, it has the problem that it is high in cost of manufacture when used to make general purpose electronic devices such as nonvolatile ferroelectric memories for which quite an economical method of manufacture is required.

In view of the problem mentioned above, it is an object of the present invention to provide a flux assisted solid phase epitaxy or epitaxial growth method by which a thin film can be made having a crystalline perfection comparable with that of a bulk crystal and at a reduced cost of manufacture.

The present inventors have discovered that a thin film which though being a thin film has a crystalline perfection comparable with that of a bulk crystal can be epitaxially grown on a substrate without requiring the state that the three phases of a vapor, a liquid and a solid phase coexist to be maintained, namely without requiring the substrate to be held at a fixed high temperature, but with a solid phase reaction after film forming, and have arrived at the present invention.

Thus, in order to achieve the object mentioned above, there is provided in accordance with the present invention a flux assisted solid phase epitaxy or epitaxial growth method characterized in that it comprises the steps of depositing a thin film of a mixture of a substance to be epitaxially grown, namely an objective substance and a flux substance on a substrate at a substrate temperature less than a eutectic point of the mixture, and heat-treating the said substrate at a temperature not less than the said eutectic point and less than whichever lower one of melting points of the objective and flux substances.

This method operates as follows: The thin film of the mixture of the objective and flux substances which is deposited on the substrate at a substrate temperature less than their eutectic point becomes an amorphous thin film in which the objective and flux substances are randomly mixed together. Heating this amorphous thin film at a temperature not less than the eutectic point causes the objective and flux substances to be rearranged by solid phase diffusion so that the free energy becomes the minimum and causes a eutectic made of the objective and flux substances to be formed. Forming the eutectic causes a liquid phase of the mixture of the objective and flux substances to be formed and the objective substance to precipitate and epitaxially grow on the substrate from the liquid phase. After the epitaxial growth is completed, the flux substance segregated on the epitaxial thin film is removed to give rise to an epitaxial thin film which though being a thin film has a crystalline perfection or crystallinity that can compare with that of a bulk crystal.

This method eliminates the hitherto required need to maintain the eutectic state during film forming and allows only the eutectic state to be formed by solid phase diffusion after film forming. Thus, without the need to control the substrate temperature in film forming, films can be formed in bulk and in lump using an inexpensive apparatus, e. g., using a CVD (chemical vapor deposition) apparatus that is capable of mass production. Also, a large-sized heat-treatment apparatus can be utilized to heat-treat film-formed substrates in lump. Thus, the process allows manufacture at a reduced cost. Also, utilizing the eutectic state to effect epitaxial growth from the liquid phase, it allows obtaining an epitaxial thin film which though being a thin film has a crystalline perfection comparable with that of a bulk crystal.

The present invention also provides a flux assisted solid phase epitaxy or epitaxial growth method characterized in that it comprises the steps of: depositing a thin film made of an objective substance and a thin film made of a flux substance on a substrate and heat-treating the said substrate at a temperature not less than their eutectic point and less that whichever lower one of melting points of the said objective and flux substances.

This method operates as follows: Heating a substrate having deposited thereon a thin film of an objective substance and a thin film of a flux substance at a temperature not less than their eutectic point causes the objective and flux substances to be rearranged by solid phase diffusion so that the free energy becomes the minimum and causes forming a eutectic made of the objective and flux substances. Forming the eutectic causes a liquid phase of the mixture of the objective and flux substances to be formed and the objective substance to precipitate and epitaxially grow on the substrate from the liquid phase. After the epitaxial growth is completed, the flux substance segregated on the epitaxial thin film is removed to give rise to an epitaxial thin film which though being a thin film has a crystalline perfection or crystallinity that can compare with that of a bulk crystal.

This method eliminates the hitherto required need to maintain the eutectic state during film forming and allows only the eutectic state to be formed by solid phase diffusion after film forming. Thus, without the need to control the substrate temperature in film forming, films can be formed in bulk and in lump using an inexpensive apparatus, e. g., using a CVD (chemical vapor deposition) apparatus that is capable of mass production. Also, a large-sized heat-treatment apparatus can be utilized to heat-treat film-formed substrates in lump. Thus, the process allows manufacture at a reduced cost. Also, utilizing the eutectic state to effect epitaxial growth from the liquid phase, it allows obtaining an epitaxial thin film which though being a thin film has a crystalline perfection comparable with that of a bulk crystal.

The flux substance is preferably of an amount that is chosen according to the thickness of a thin film to be epitaxially grown so that the amounts of the objective and flux substances have a composition ratio at the eutectic point. If the composition ratio is so selected, the heat treatment may be effected at the eutectic point so that the epitaxial growth can be effected at a lower temperature.

The objective substance may be a multi-component oxide of which Bi is a constituent element, and the flux substance may be a substance producing a eutectic with the multi-component oxide which contains Bi as a constituent element but not producing any compound with the multi-component oxide of which Bi is a constituent element.

The multi-component oxide of which Bi is a constituent element may be $Bi_4Ti_3O_{12}$, $Bi_4BaTi_4O_{15}$, $SrBi_2Ta_2O_3$ or $Bi_2Sr_2CaCu_2O_8$, and the flux substance may be a ternary composition of $Bi_2O_3$—CuO—TiO. If the multi-component oxide of which Bi is a constituent element is $Bi_4Ti_3O_{12}$, then the ternary flux composition $Bi_2O_3$—CuO—TiO may be $Bi_2O_3$. The substrate is preferably a single-crystal substrate or a substrate covered with a single-crystal thin film. The said single-crystal substrate or single-crystal thin film may be $SrTiO_3$, $Al_2O_3$, Si, $LaAlO_3$, MgO or $NdGaO_3$.

BEST MODES FOR CARRYING OUT THE INVENTION

The present invention will better be understood from the following detailed description and the drawings attached hereto showing certain illustrative forms of implementation of the present invention. In this connection, it should be noted that such forms of implementation illustrated in the accompanying drawings hereof are intended in no way to limit the present invention but to facilitate an explanation and understanding thereof.

At the outset, an explanation is given in respect of the first form of implementation of the present invention.

First, a flux is selected which is optimum for a substance to be epitaxially grown, namely an objective substance. The flux is of a substance producing a eutectic with the objective substance but not producing any compound with the objective substance.

Next, a single-crystal substrate or a substrate covered with a single-crystal thin film is disposed in a film forming apparatus, and a mixture of the objective and flux substances is deposited on the substrate to form a thin film thereof. The temperature during film forming need not especially be controlled and the thin film may, for example, be formed at room temperature without necessitating temperature control. This thin film is an amorphous thin film in which the objective and flux substances are randomly mixed together. At this juncture, preferably the objective and flux substances have their amounts corresponding to a composition ratio at a eutectic point thereof and the flux substance has its amount suitably selected in accordance with a particular thickness needed of the objective substance.

With respect to the film forming method, use may be made of, e. g., MOCVD (metal organic chemical vapor deposition) in which the flow rates of organometallic gases and other source gases of metallic elements constituting the amorphous thin film are controlled in accordance with the composition ratios of components of the amorphous thin film. Also, if use is made of sputtering, a target may be used which has the composition ratios of components of the amorphous thin film. If laser ablation is used, use may be made of a target having the composition ratios of components of the amorphous thin film, or a target having the composition of the objective substance and a target having the composition of the flux substance for alternate ablation.

Next, the substrate having the amorphous thin film deposited thereon in which the objective and flux substances are mixed together is disposed in a heat-treatment apparatus and heat-treated at a temperature not less than the eutectic point and lower than whichever lower one of melting points of the objective and flux substances. In this process step, the objective and flux substances of the amorphous thin film are mutually diffused in solid phase and mixed together in a state that the free energy becomes the minimum. The mixed state that the free energy becomes the minimum is a state that the objective and flux substances form their eutectic. And, with the eutectic formed, not only is formed a liquid phase in which objective and flux substances are mixed together, but also objective substances precipitate from the liquid phase onto the substrate and epitaxially grow thereon. With the objective substances epitaxially growing from the liquid phase state, conditions for this epitaxial growth are growth conditions close to thermal equilibrium conditions as in the liquid phase epitaxy. Thus, a thin film can be grown which though being a thin film has a crystalline perfection or crystallinity comparable with that of a bulk crystal.

Subsequently, the substrate is taken out of the heat-treatment apparatus and the flux segregated on the thin film of the objective substance is removed, e. g., by dissolution with a chemical material. With the chemical material which depends on the type of the flux, the flux can be easily removed since it is of the substances which do not produce any compound with the objective substances.

An explanation is next given in respect of the second form of implementation of the present invention.

The second form of implementation of the invention differs from the first form of implementation only in that instead of the amorphous thin film in which objective and flux substances are mixed together, a thin film made of objective substance and a thin film made of flux substance are deposited on the substrate. In this case, too, the heat treatment at a temperature not less than the eutectic point and less than whichever lower one of melting points of the objective and flux substances causes the objective and flux substances to be mutually diffused by solid phase diffusion to reach their mixed state that the free energy becomes the minimum. The mixed state that the free energy becomes the minimum is a state that the objective and flux substances form their eutectic. And, with the eutectic formed, not only is formed a liquid phase in which objective and flux substances are mixed together, but also objective substances precipitate from the liquid phase onto the substrate and epitaxially grow thereon. With the objective substances epitaxially growing from the liquid phase state, conditions for this epitaxial growth are growth conditions close to thermal equilibrium conditions as in the liquid phase epitaxy. Thus, a thin film can be grown which though being a thin film has a crystalline perfection or crystallinity comparable with that of a bulk crystal.

Subsequently, the substrate is taken out of the heat-treatment apparatus and the flux segregated on the thin film of the objective substance is removed, e. g., by dissolution with a chemical material. With the chemical material which depends on the type of the flux, the flux can be easily removed since it is of the substances which do not produce any compound with the objective substances.

The present invention will now be described in detail with reference to specific example thereof.

Mention is first made of an example for the first form of implementation of the invention.

In this case, the objective substance is $Bi_4Ti_3O_{12}$ and the flux substance is $Bi_2O_3$.

According to the method of the first form of implementation, film forming was effected by laser ablation, using a (001) face $SrTiO_3$ substrate. A target made of a sintered body of $Bi_4Ti_3O_{12}$ and a target made of a sintered body of $Bi_2O_3$ were alternately ablated to form an amorphous thin film as a build-up of about 300 nm at $Bi_4Ti_3O_{12}$ film equivalent and about 300 nm at $Bi_2O_3$ film equivalent. The substrate temperature in film forming was room temperature, and the laser ablation was carried out in an oxygen atmosphere of 67 Pa to compensate for a loss of oxygen during film forming. The heat treatment was effected using a dedicated heat-treatment furnace and at 1000° C. in the atmosphere for 12 hours. The takeout from the heat-treatment furnace was done while rapidly quenching from the heat-treatment furnace at 1000° C. to the atmosphere at room temperature. Also, for a comparison with the prior art, a $Bi_4Ti_3O_{12}$ thin film was prepared that differed in that the $Bi_2O_3$ flux was not used.

Figure 1:
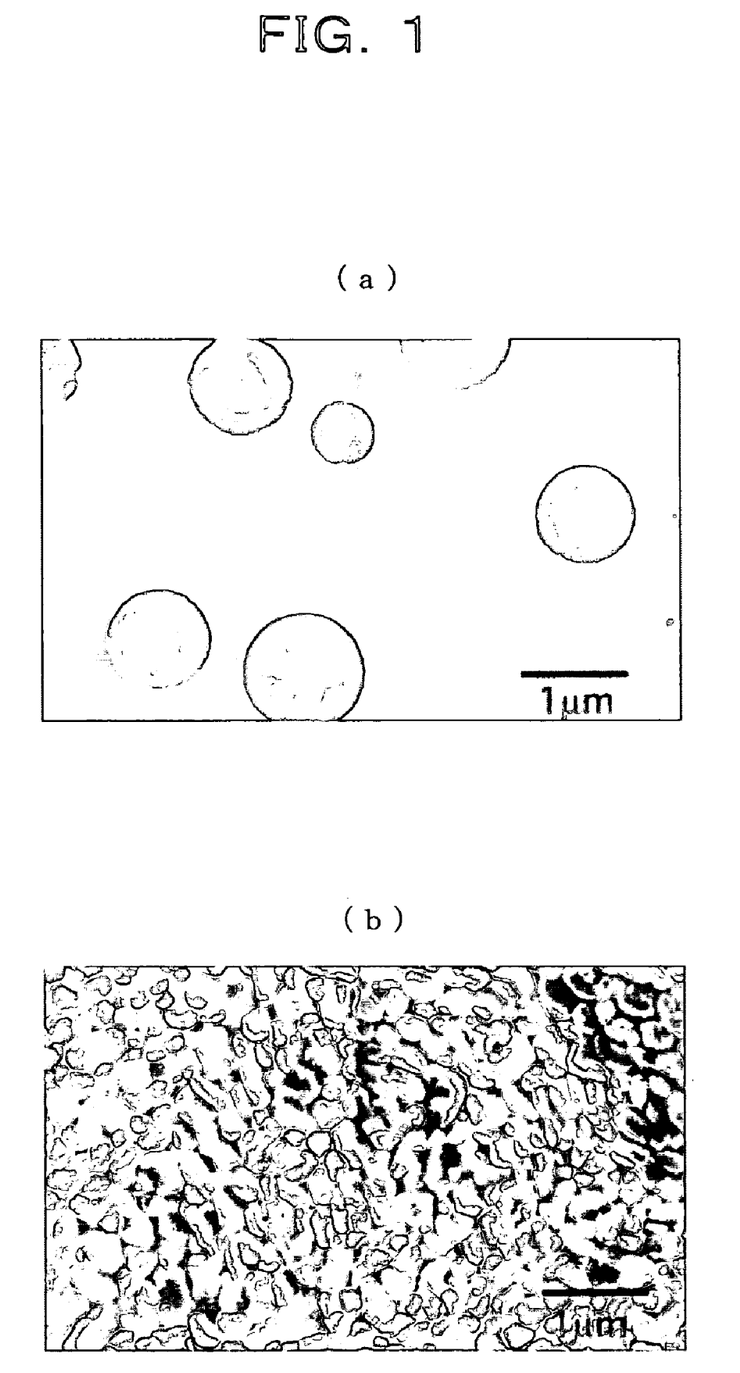
FIG. 1 shows a scanning electron microscopic image illustrating a surface configuration of a $Bi_4Ti_3O_{12}$ thin film fabricated by a flux assisted solid phase epitaxy according to a first form of implementation of the present invention.

FIG. 1 shows a scanning electron microscopic image illustrating a surface configuration of the $Bi_4Ti_3O_{12}$ thin film fabricated by the flux assisted solid phase epitaxy according to the first form of implementation of the present invention. FIG. 1(a) is the scanning electron microscopic image illustrating the surface configuration of the $Bi_4Ti_3O_{12}$ thin film fabricated by the flux assisted solid phase epitaxy according to the first form of implementation, and FIG. 1(b) is a scanning electron microscopic image illustrating a surface configuration of the $Bi_4Ti_3O_{12}$ thin film fabricated for comparison according to the prior art.

In FIG. 1(a), globular particles indicate segregated $Bi_2O_3$ particles whose ground is the $Bi_4Ti_3O_{12}$ thin film. As can be seen from the Figure, the $Bi_4Ti_3O_{12}$ thin film has an extremely flat surface, indicating that it has no grain and is of a single crystal over the entire thin film. And, in FIG. 1(b), small elliptical particles indicate $Bi_4Ti_3O12$ grains, indicating that according to the prior art there results a polycrystal and no thin film high in crystalline perfection is obtained.

Figure 2:
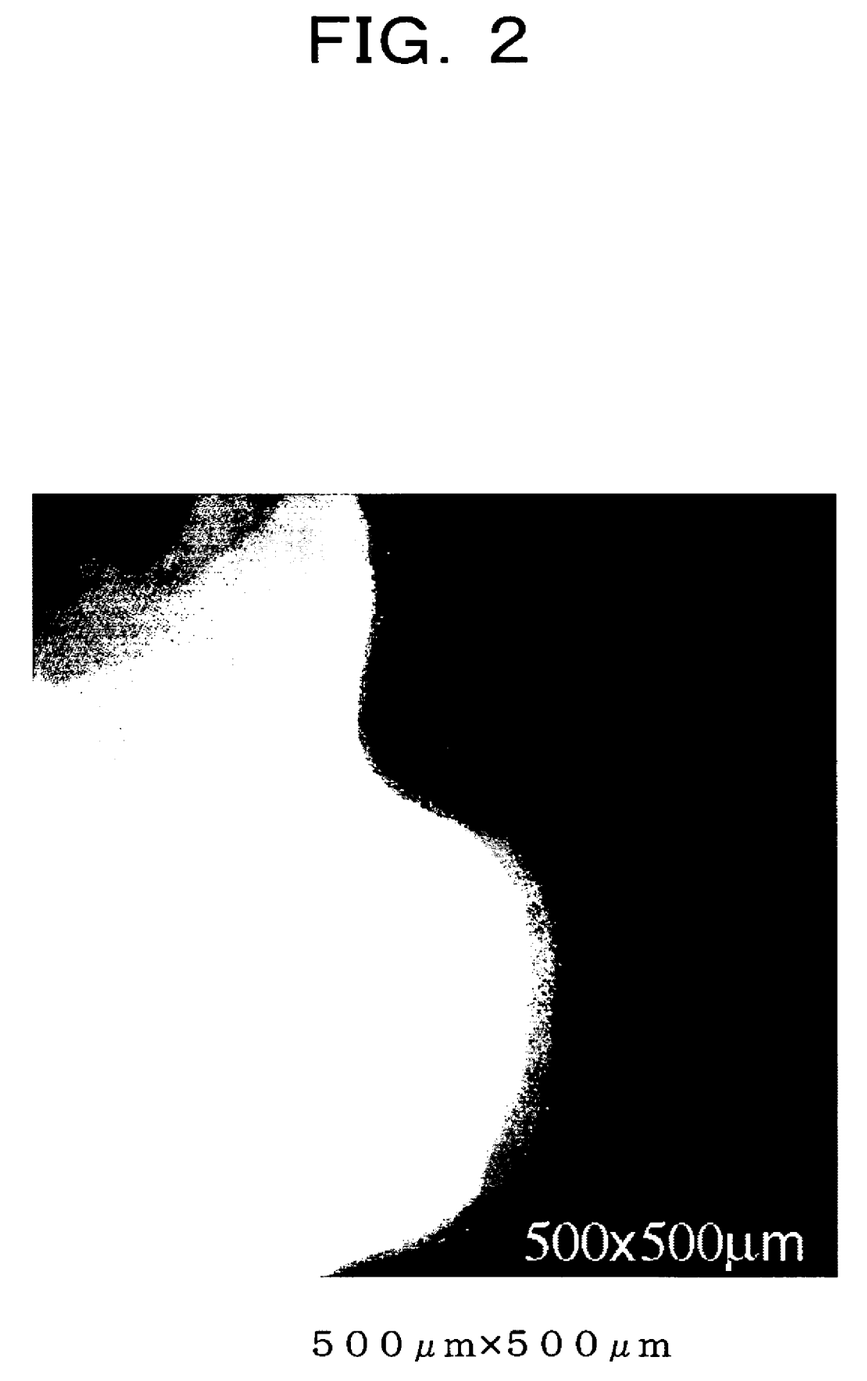
FIG. 2 is an AFM (atomic force micrometer) image illustrating a configuration of a surface of the $Bi_4Ti_3O_{12}$ thin film fabricated by the flux assisted solid phase epitaxy according to the first form of implementation of the present invention.

FIG. 2 is an AFM (atomic force micrometer) image illustrating a configuration of a surface of the $Bi_4Ti_3O_{12}$ thin film fabricated by the flux assisted solid phase epitaxy according to the first form of implementation of the present invention. In the Figure, the stepped planes indicate atomic planes of $Bi_4Ti_3O_{12}$. Also, from height measurements by AFM, it has been found that the step spaces correspond to the spaces of half atomic layers of $Bi_4Ti_3O_{12}$. From the Figure, it is seen that since each atomic plane is atomically flat and the atomic planes lie at the spaces of the half atomic layers, the surface of the $Bi_4Ti_3O_{12}$ thin film fabricated by the present method is atomically flat.

From these results, it is seen that the flux assisted solid phase epitaxy of the first form of implementation gives rise to a single-crystal thin film extremely high in crystalline perfection or crystallinity.

Next, mention is made of a specific example of the second form of implementation of the present invention wherein again the objective substance is $Bi_4Ti_3O_{12}$ and the flux substance is $Bi_2O_3$.

According to the method of the second form of implementation, film forming was effected by laser ablation, using a (001) face $SrTiO_3$ substrate. A target made of a sintered body of $Bi_4Ti_3O_{12}$ was ablated at a substrate temperature of 700° C. in an atmosphere of an oxygen pressure of 67 Pa to deposit a $Bi_4Ti_3O_{12}$ thin film of about 300 nm on the substrate. Subsequently, a target made of a sintered body of $Bi_2O_3$ was ablated on the $Bi_4Ti_3O_{12}$ thin film at a substrate temperature of 500° C. in an atmosphere of an oxygen pressure of 67 Pa to deposit a $Bi_2O_3$ thin film of about 300 nm. The heat treatment was effected using a dedicated heat-treatment furnace and at 800° C. in an oxygen atmosphere of 1300 Pa for 12 hours. Also, the takeout from the heat-treatment furnace was done while rapidly quenching from the heat-treatment furnace at 800° C. to the atmosphere at room temperature. Further, for a comparison with the prior art, a $Bi_4Ti_3O_{12}$ thin film was prepared that differed in that the $Bi_2O_3$ flux was not used.

Figure 3:
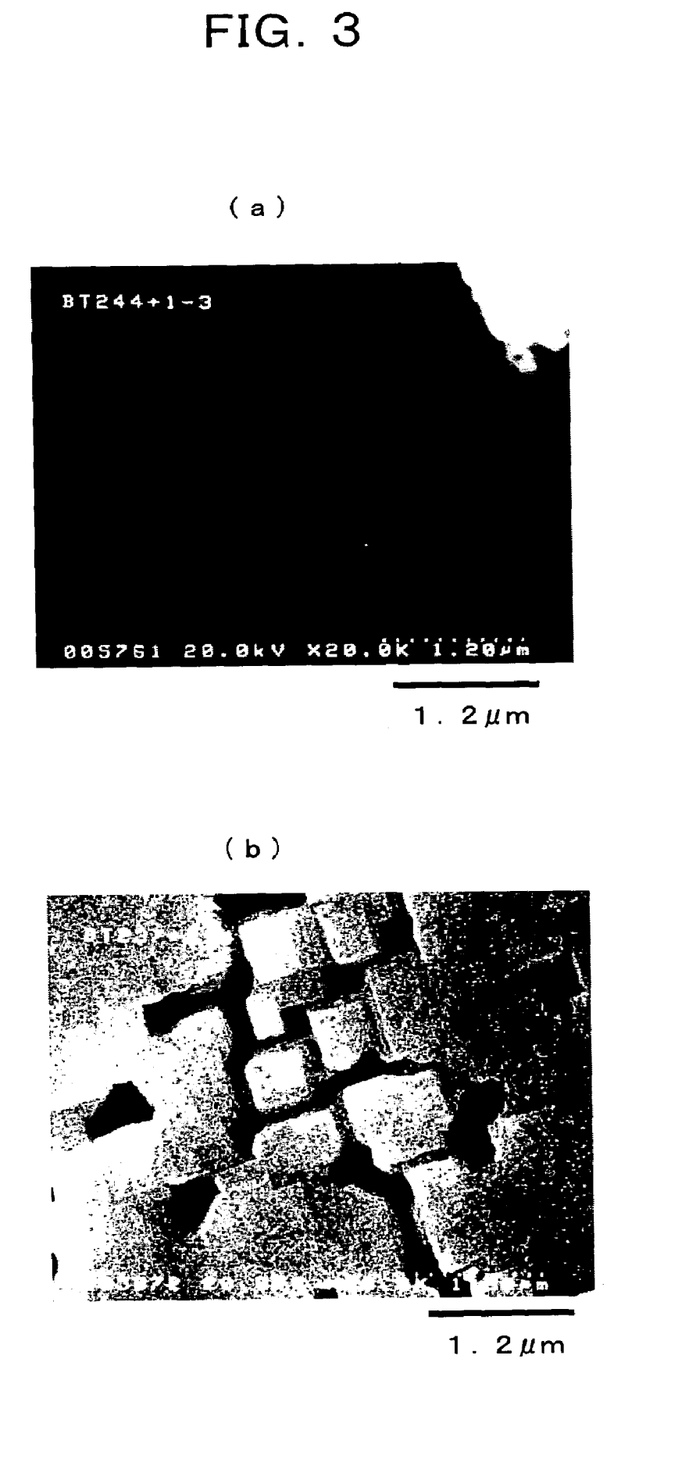
FIG. 3 shows a scanning electron microscopic image illustrating a surface configuration of a $Bi_4Ti_3O_{12}$ thin film fabricated by a flux assisted solid phase epitaxy according to a second form of implementation of the present invention.

FIG. 3 shows a scanning electron microscopic image illustrating a surface configuration of the $Bi_4Ti_3O_{12}$ thin film fabricated by the flux assisted solid phase epitaxy according to the second form of implementation of the present invention. FIG. 3(a) is the scanning electron microscopic image illustrating the surface configuration of the $Bi_4Ti_3O_{12}$ thin film fabricated by the flux assisted solid phase epitaxy according to the second form of implementation, and FIG. 3(b) is a scanning electron microscopic image illustrating a surface configuration of the $Bi_4Ti_3O_{12}$ thin film fabricated for comparison according to the prior art.

As can be seen from FIG. 3(a), the surface of the $Bi_4Ti_3O_{12}$ thin film is extremely flat, indicating that it has no grain and is of a single crystal over the entire thin film. Also, in FIG. 3(b), the dark areas indicate holes opened in the thin film, indicating that according to the prior art no thin film high in crystalline perfection is obtained. Also, while as in the case of FIG. 2 the surface configuration was measured by AFM images, an image as in FIG. 2 was obtained, from which it has been determined that a surface atomically flat is obtained according to the second form of implementation as well.

Figure 4:
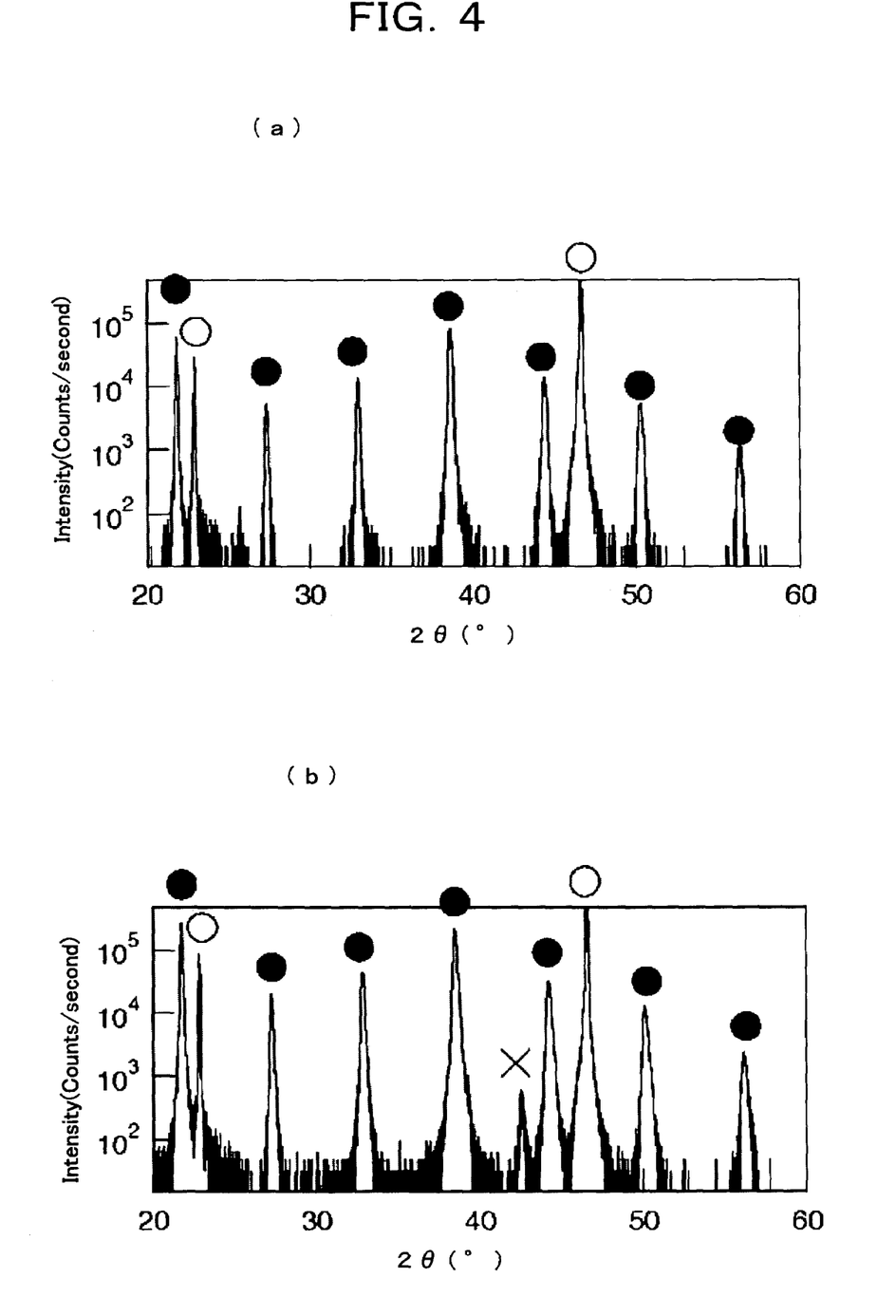
FIG. 4 shows a graph illustrating an X-ray diffraction pattern of the $Bi_4Ti_3O_{12}$ thin film fabricated by the flux assisted solid phase epitaxy according to the second form of implementation of the present invention.

FIG. 4 shows a graph illustrating an X-ray diffraction (XRD) pattern of the $Bi_4Ti_3O_{12}$ thin film fabricated by the flux assisted solid phase epitaxy according to the second form of implementation of the present invention. FIG. 4(a) is the graph illustrating the XRD pattern of the $Bi_4Ti_3O_{12}$ thin film fabricated by the flux assisted solid phase epitaxy according to the second form of implementation of the present invention, and FIG. 4(b) shows an XRD pattern of a $Bi_4Ti_3O_{12}$ thin film fabricated by the prior art for comparison. ● indicates diffraction peaks of $Bi_4Ti_3O_{12}$ of perovskite type, ○ indicates diffraction peaks of the $SrTiO_3$ substrate, and × indicates a diffraction peak of a phase of $Bi_4Ti_3O_{12}$ other than perovskite type.

From the graph of FIG. 4(a) in which the diffraction peaks of perovskite $Bi_4Ti_3O_{12}$ and that of the $SrTiO_3$ substrate only are observed, it is seen that only the perovskite $Bi_4Ti_3O_{12}$ phase is formed by the flux assisted solid phase epitaxy. On the other hand, from the graph of FIG. 4(b) in which a peak of a phase other than perovskite type of $Bi_4Ti_3O_{12}$ is observed, it is seen that it has been difficult to form a $Bi_4Ti_3O_{12}$ thin film of a monolayer by the prior art.

Figure 5:
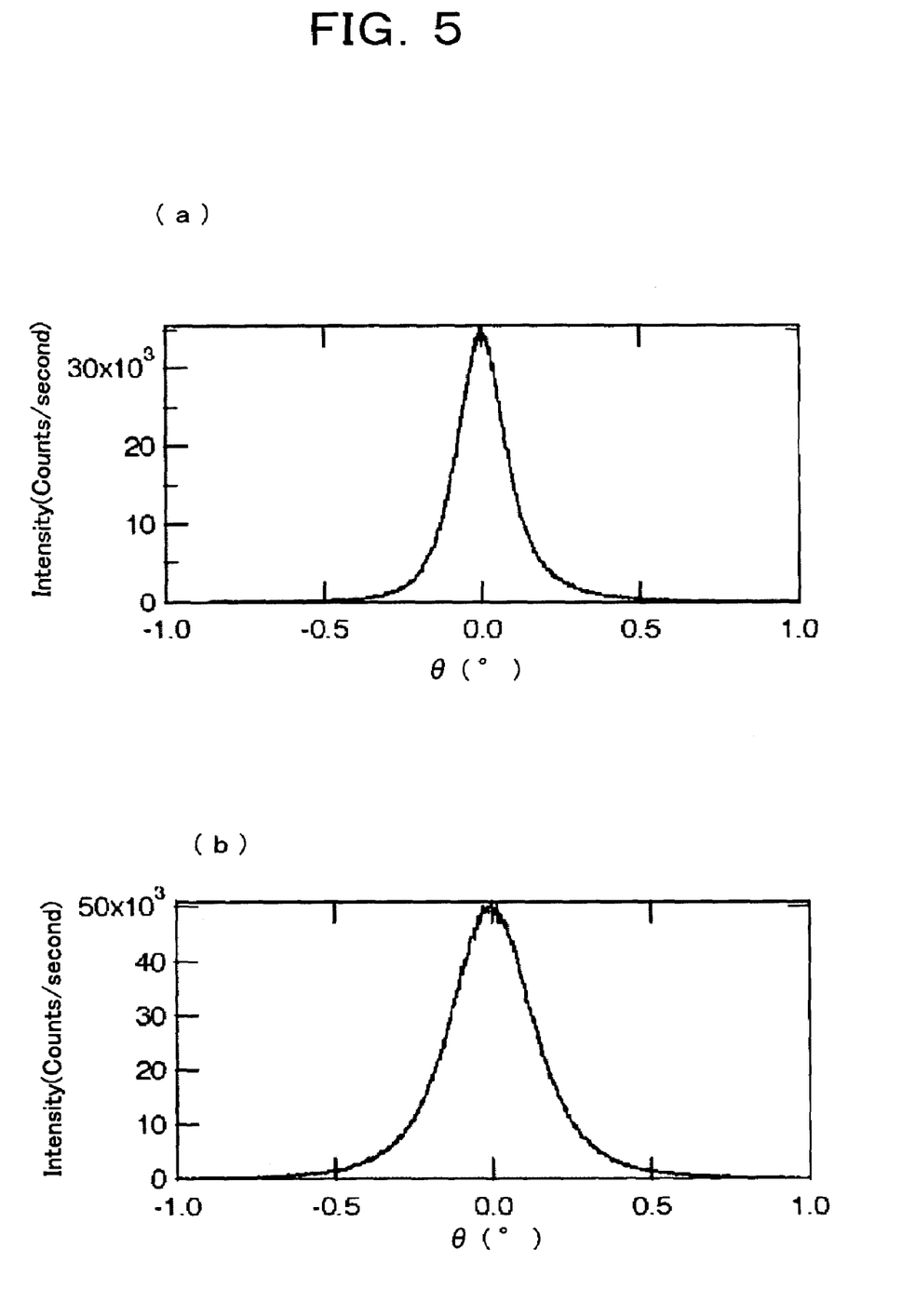
FIG. 5 shows a graph illustrating an X-ray rocking curve pattern of the $Bi_4Ti_3O_{12}$ thin film fabricated by the flux assisted solid phase epitaxy according to the second form of implementation of the present invention.

FIG. 5 shows a graph illustrating an X-ray rocking curve pattern of the $Bi_4Ti_3O_{12}$ thin film fabricated by the flux assisted solid phase epitaxy according to the second form of implementation of the present invention. FIG. 5(a) is the graph illustrating the X-ray rocking curve pattern of the $Bi_4Ti_3O_{12}$ thin film fabricated by the flux assisted solid phase epitaxy according to the second form of implementation, and FIG. 5(b) is a graph illustrating an X-ray rocking curve pattern measured for comparison of a $Bi_4Ti_3O_{12}$ thin film fabricated by the prior art. The diffraction peak used for each measurement is that of perovskite $Bi_4Ti_3O_{12}$ (0014) face.

FIG. 5(a) shows that the $Bi_4Ti_3O_{12}$ thin film fabricated by the flux assisted solid phase epitaxy of the second form of implementation of the invention has a half-value breadth as very narrow as 0.186° and is of single crystal. On the other hand, FIG. 5(b) shows that $Bi_4Ti_3O_{12}$ thin film fabricated by the prior art has a half-value breadth as large as 0.286° and is of polycrystal.

From the results shown above, it is seen that a single-crystal thin film extremely high in crystalline perfection is obtained by a flux assisted solid phase epitaxy or epitaxial growth method according to the present invention.

Although the present invention has hereinbefore been set forth with respect to certain illustrative embodiments thereof, it should be understood that the invention is not intended to be limited to the specific embodiments thereof set forth above, but to include all possible embodiments that can be made within the scope with respect to the features specifically set forth in the appended claims and to encompass all the equivalents thereof.

INDUSTRIAL APPLICABILITY

A flux assisted solid phase epitaxy or epitaxial growth method according to the present invention makes it possible to obtain a thin film which though being a thin film has a crystalline perfection or crystallinity that compares with that of a bulk crystal. Also, permitting it to be made at a reduced cost, the method is extremely useful when used, e. g., as a method of making a thin film for a nonvolatile ferroelectric memory having a degree of integration on a VLSI level.

What is claimed is:

1. A flux assisted solid phase epitaxial growth method, characterized in that it comprises the steps of:
    depositing an amorphous thin film made of an objective substance and a flux of a substance producing a eutectic with said objective substance but not producing any compound with said objective substance, on a substrate at a first temperature, and
    heat-treating said substrate at a second temperature so as to form a eutectic made of said objective and flux substances; wherein
    said first temperature is less than a eutectic point of said objective and flux substances, and
    said second temperature is not less than the eutectic point of said objective and flux substances and less than the lower melting point of said objective and flux substances.

2. A flux assisted solid phase epitaxial growth method as set forth in claim 1, characterized in that said flux is of an amount which is selected according to an amount of said objective substance to be grown so that the objective and flux substances have a composition ratio at said eutectic point.

3. A flux assisted solid phase epitaxial growth method, characterized in that it comprises the steps of:
    depositing a thin film made of an objective substance and a thin film made of a flux of a substance producing a eutectic with said objective substance but not producing any compound with said objective substance, on a substrate at a first temperature, and heat-treating said substrate at a second temperature so as to form a eutectic made of said objective and flux substances; wherein said first temperature is less than a eutectic point of said objective and flux substances, and said second temperature is not less than the eutectic point of said objective and flux substances and less than the lower melting point of said objective and flux substances.

4. A flux assisted solid phase epitaxial growth method as set forth in claim 3, characterized in that said flux is of an amount which is selected according to an amount of said objective substance to be grown so that the objective and flux substances have a composition ratio at said eutectic point.

5. A flux assisted solid phase epitaxial growth method, characterized in that it comprises the steps of:

depositing an amorphous thin film made of an objective substance and a flux of a substance producing a eutectic with said objective substance but not producing any compound with said objective substance, on a substrate at a temperature less than a eutectic point of said objective and flux substances, and heat-treating said substrate at a temperature not less than the eutectic point of said objective and flux substances and less than the lower melting point of said objective and flux substances, wherein said objective substance is a multi-component oxide which contains Bi as a constituent element, and said flux is of the substance producing the eutectic with said multi-component oxide containing Bi as a constituent element and not producing any compound therewith.

6. A flux assisted solid phase epitaxial growth method as set forth in claim 5, characterized in that said multi-component oxide which contains Bi as a constituent element is one selected from the group which consists of $Bi_4Ti_3O_{12}$, $Bi_4BaTi_4O_{15}$, $SrBi_2Ta_2O_3$ and $Bi_2Sr_2CaCu_2O_8$, and said flux is a ternary composition of $Bi_2O_3$—CuO—TiO family.

7. A flux assisted solid phase epitaxial growth method as set forth in claim 6, characterized in that said multi-component oxide which contains Bi as a constituent element is $Bi_4Ti_3O_{12}$, and said ternary composition of $Bi_2O_3$—CuO—TiO family is $Bi_2O_3$.

8. A flux assisted solid phase epitaxial growth method as set forth in claim 5, characterized in that said substrate is a single-crystal substrate or a substrate covered with a single-crystal thin film.

9. A flux assisted solid phase epitaxial growth method as set forth in claim 8, characterized in that said single-crystal substrate or said single-crystal thin film is of one composition selected from the group which consists of $SrTiO_3$, $Al_2O_3$, Si, $LaAlO_3$, MgO and $NdGaO_3$.

10. A flux assisted solid phase epitaxial growth method as set forth in claim 5, characterized in that said flux is of an amount which is selected according to an amount of said objective substance to be grown so that the objective and flux substances have a composition ratio at said eutectic point.

11. A flux assisted solid phase epitaxial growth method, characterized in that it comprises the steps of:

depositing a thin film made of an objective substance and a thin film made of a flux of a substance producing a eutectic with said objective substance but not producing any compound with said objective substance, on a substrate at a temperature less than a eutectic point of said objective and flux substances, and heat-treating said substrate at a temperature not less than the eutectic point of said objective and flux substances and less than the lower melting point of said objective and flux substances, wherein said objective substance is a multi-component oxide which contains Bi as a constituent element, and said flux is of the substance producing the eutectic with said multi-component oxide containing Bi as a constituent element and not producing any compound therewith.

12. A flux assisted solid phase epitaxial growth method as set forth in claim 10, characterized in that said flux is of an amount which is selected according to an amount of said objective substance to be grown so that the objective and flux substances have a composition ratio at said eutectic point.

13. A flux assisted solid phase epitaxial growth method as set forth in claim 10, characterized in that said substrate is a single-crystal substrate or a substrate covered with a single-crystal thin film.

14. A flux assisted solid phase epitaxial growth method as set forth in claim 11, characterized in that said substrate is a single-crystal substrate or a substrate covered with a single-crystal thin film.

15. A flux assisted solid phase epitaxial growth method as set forth in claim 12, characterized in that said substrate is a single-crystal substrate or a substrate covered with a single-crystal thin film.

\* \* \* \* \*